(12) United States Patent
Kim et al.

(10) Patent No.: US 12,724,341 B2
(45) Date of Patent: Sep. 1, 2026

(54) PHOTOMASK FOR EXTREME ULTRAVIOLET

(71) Applicant: LuminaMask Co., Ltd., Cheonan-si (KR)

(72) Inventors: Seong Yoon Kim, Seoul (KR); Tae Young Kim, Seoul (KR); GeonGon Lee, Seoul (KR); Min Gyo Jeong, Seoul (KR); Sung Hoon Son, Seoul (KR); Inkyun Shin, Seoul (KR)

(73) Assignee: LuminaMask Co., Ltd., Cheonan-si (KR)

( * ) Notice: Subject to any disclaimer, the term of this patent is extended or adjusted under 35 U.S.C. 154(b) by 764 days.

(21) Appl. No.: 18/187,829

(22) Filed: Mar. 22, 2023

(65) Prior Publication Data

US 2023/0305382 A1 Sep. 28, 2023

(30) Foreign Application Priority Data

Mar. 22, 2022 (KR) ........................ 10-2022-0035162

(51) Int. Cl.
*G03F 1/24* (2012.01)

(52) U.S. Cl.
CPC ..................................... *G03F 1/24* (2013.01)

(58) Field of Classification Search
CPC ..................................... G03F 1/24; G03F 1/58
See application file for complete search history.

(56) References Cited

U.S. PATENT DOCUMENTS

2008/0248409 A1* 10/2008 Ishibashi ................ B82Y 10/00 430/5
2021/0063865 A1* 3/2021 Lin ........................... G03F 1/38
2021/0072634 A1* 3/2021 Shiobara ................... G03F 1/24
(Continued)

FOREIGN PATENT DOCUMENTS

JP 6-79157 B2 10/1986
KR 10-0801484 B1 2/2008
(Continued)

OTHER PUBLICATIONS

Kim, Tae Guen, et al. "Optical and Physical Characteristics of EUV Phase Shift Masks." *2007 International Extreme Ultraviolet Lithography (EUVL) Symposium*. EUVA, (2007). pp 1-16.

*Primary Examiner* — Stewart A Fraser
(74) *Attorney, Agent, or Firm* — NSIP Law

(57) ABSTRACT

An extreme ultraviolet photomask includes a conductive layer; a substrate disposed on the conductive layer; a multilayer, comprising different metals alternately stacked on the substrate; a protective layer disposed on the multilayer; a low-reflectance part disposed on a portion of the protective layer, wherein the low-reflectance part comprises a first absorbent layer disposed on the portion of the protective layer, a low-reflectance layer formed on the first absorbent layer, and a first intagliated part formed at the portion where the protective layer is exposed; and a high-reflectance part disposed on another portion of the protective layer, wherein the high-reflectance part comprises a second absorbent layer disposed on the other portion of the protective layer, a high-reflectance layer disposed on the second absorbent layer, and a second intagliated part formed at the other where the protective layer is exposed.

17 Claims, 3 Drawing Sheets

(56) References Cited

U.S. PATENT DOCUMENTS

| | | | | |
|---|---|---|---|---|
| 2021/0318608 | A1* | 10/2021 | Kim | G03F 1/26 |
| 2022/0121101 | A1* | 4/2022 | Tanady | G03F 1/24 |
| 2022/0121102 | A1* | 4/2022 | Shoki | G03F 1/24 |

FOREIGN PATENT DOCUMENTS

| | | | |
|---|---|---|---|
| KR | 10-1034319 | B1 | 5/2011 |
| KR | 10-2013-0085774 | A | 7/2013 |
| KR | 10-2015-0059615 | A | 6/2015 |
| KR | 10-2018-0127197 | A | 11/2018 |
| KR | 10-2109129 | B1 | 5/2020 |
| KR | 10-2171266 | B1 | 10/2020 |
| KR | 10-2279529 | B1 | 7/2021 |

* cited by examiner

PHOTOMASK FOR EXTREME ULTRAVIOLET

CROSS-REFERENCE TO RELATED APPLICATIONS

This application claims the benefit under 35 USC 119(a) of Korean Patent Application No. 10-2022-0035162 filed on Mar. 22, 2022, in the Korean Intellectual Property Office, the entire disclosure of which is incorporated herein by reference for all purposes.

BACKGROUND

1. Field

The following description relates to a photomask for extreme ultraviolet

2. Description of Related Art

A specific semiconductor, such as memory, can be mainly divided into a main cell area and a peripheral & core area. The peripheral (shortened to "peri") area functions as a controller for data stored in cells to work properly and occupies an area of about 20 to 40% within the whole area. The main cell can accommodate a unit memory and memory cells.

An exposure process for forming such a semiconductor circuit may apply a phase difference extreme ultraviolet (EUV) photomask. When a circuit with a special pattern layout is formed, further elaborate extreme ultraviolet photomask may be desired. In this case, ordinarily, two types of photomasks have specific reflectance values suitable for using each pattern layout; for example, a photomask for forming a main cell and a photomask for forming a peripheral & core must be manufactured to be used. This conventional procedure requires manufacturing processes of a semiconductor to be performed twice or more by using respective photomasks, in addition to causing an increase of cost for manufacturing photomasks, and thereby may increase the prime cost and loss of productivity.

The background technology mentioned in the above is technical information kept by inventors for deriving example embodiments or achieved by inventors during the deriving processes, and cannot necessarily be considered as noticed technology opened to general public before application of the present disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an extreme ultraviolet photomask includes a conductive layer; a substrate disposed on the conductive layer; a multilayer, comprising different metals alternately stacked on the substrate; a protective layer disposed on the multilayer; a low-reflectance part disposed on a portion of the protective layer, wherein the low-reflectance part comprises a first absorbent layer disposed on the portion of the protective layer, a low-reflectance layer formed on the first absorbent layer, and a first intagliated part formed at the portion where the protective layer is exposed; and a high-reflectance part disposed on another portion of the protective layer, wherein the high-reflectance part comprises a second absorbent layer disposed on the other portion of the protective layer, a high-reflectance layer disposed on the second absorbent layer, and a second intagliated part formed at the other where the protective layer is exposed.

A first layer of the multilayer may include molybdenum, and a second layer of the multilayer may include silicon or beryllium.

The first layer may have a thickness of 1 nm to 5 nm, and the second layer may have a thickness of 2 nm to 6 nm.

The protective layer may include one selected from the group consisting of ruthenium, ruthenium silicide, a chrome-based material, and combinations thereof.

The protective layer may have a thickness of 1 nm to 4 nm.

The low-reflectance layer and the high-reflectance layer may include a metal oxide. A laminate including the low-reflectance layer, the first absorbent layer and the protective layer may have a reflectance of 3% to 8% for extreme ultraviolet with a wavelength of 13.5 nm, and another laminate including the high-reflectance layer, the second absorbent layer and the protective layer may have a reflectance of 10% to 40% for extreme ultraviolet with the wavelength of 13.5 nm.

The low-reflectance layer may have a thickness of 12 nm to 30 nm, and the high-reflectance layer may have a thickness of 4 nm to 10 nm.

A thickness ratio of the thickness of the low-reflectance to the thickness of the high-reflectance layer may have a value of 1.2 to 7.5.

The metal oxide may include one selected from the group consisting of silica, alumina, and combinations thereof.

Each of the first absorbent layer and the second absorbent layer may include a lower absorbent layer formed on the protective layer, and an upper absorbent layer formed on the lower absorbent layer. The lower absorbent layer may include tantalum nitride, and the upper absorbent layer may include molybdenum.

The lower absorbent layer may have a thickness of 1 nm to 5 nm, and the upper absorbent layer may have a thickness of 20 nm to 40 nm.

A thickness ratio of the thickness of the lower absorbent layer to the thickness of the upper absorbent layer may have a value of 0.025 to 0.25.

In another general aspect, an extreme ultraviolet photomask includes a substrate disposed on a conductive layer; a multilayer, comprising a first layer of molybdenum, and a second layer of silicon or beryllium alternately stacked on the substrate; a protective layer disposed on the multilayer; a low-reflectance part disposed on a portion of the protective layer, wherein the low-reflectance part comprises a first absorbent layer disposed on the portion of the protective layer, a low-reflectance layer formed on the first absorbent layer, and a first intagliated part formed at the portion where the protective layer is exposed; and a high-reflectance part disposed on another portion of the protective layer, wherein the high-reflectance part comprises a second absorbent layer disposed on the other portion of the protective layer, a high-reflectance layer disposed on the second absorbent layer, and a second intagliated part formed at the other where the protective layer is exposed.

The first and the second layers may be alternately stacked to have a total number of layers between 40 to 200 layers.

The first and the second layers may be alternately stacked to have a total of 50 to 160 layers.

Other features and aspects will be apparent from the following detailed description, the drawings, and the claims.

BRIEF DESCRIPTION OF THE DRAWINGS

FIG. 2 is a ground plan depicting an upper position view of an example of a photomask for extreme ultraviolet according to example embodiments.

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
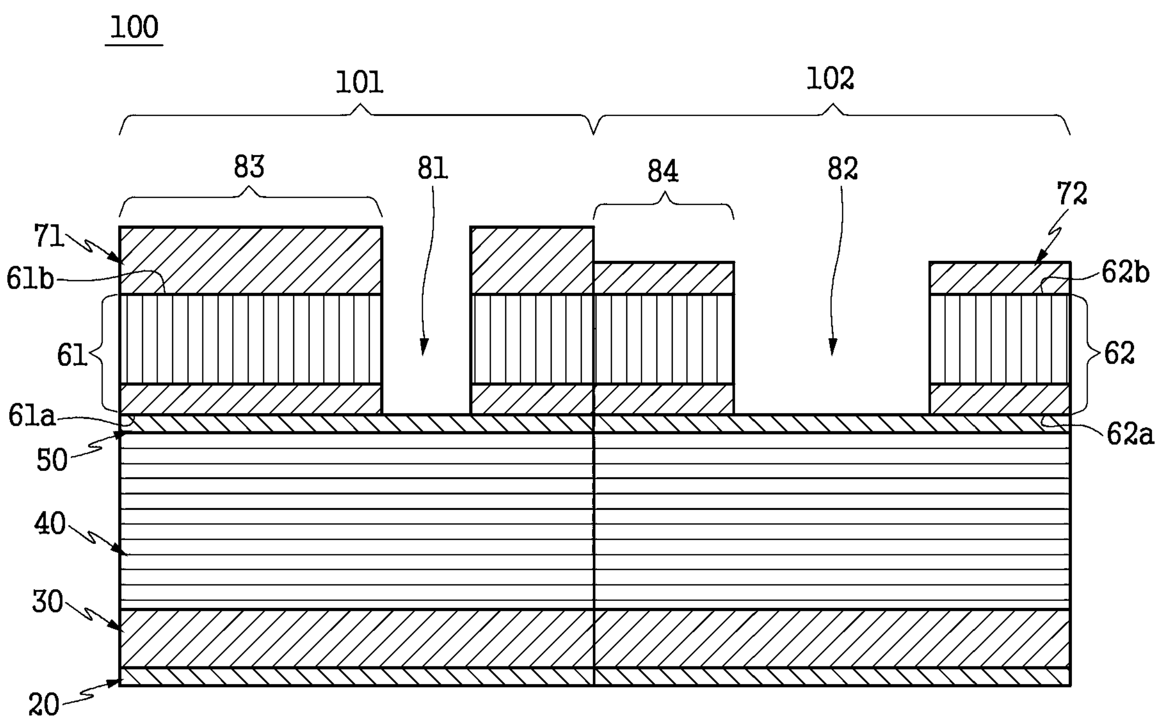
FIG. 1 is a sectional view depicting an example of an internal section of a photomask for extreme ultraviolet according to example embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this application, "B being placed on A" means that B is placed in direct contact with A or placed over A with another layer or structure interposed therebetween and thus should not be interpreted as being limited to B being placed in direct contact with A.

Throughout this application, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this application, the description of "A and/or B" means "A, B, or A and B."

In this application, a singular form is contextually interpreted as including a plural form as well as a singular form unless specially stated otherwise.

One of the objectives of the present disclosure is to provide a photomask with areas having patterns whose reflectance values are different from each other, while being suitably manufactured to prevent side lobe problems in a photomask with a high reflectance, and increase efficiency of manufacturing processes.

Blank Mask for Extreme Ultraviolet 1

In one or more embodiments, a blank mask for extreme ultraviolet 1, may comprise a conductive layer 20; a substrate 30 formed on the conductive layer; a multilayer 40 formed by different kinds of metals stacked alternately on the substrate; a protective layer 50 formed on the multilayer;

a preliminary low-reflectance part 11, which is one of some portions on the protective layer; and a preliminary high-reflectance part 12, which is the other of some portions on the protective layer.

The preliminary low-reflectance part 11 may comprise a preliminary absorbent layer 6 formed on some parts on the protective layer; a preliminary low-reflectance layer 7 formed on the preliminary absorbent layer; and an etching prevention layer 9 formed on the preliminary low-reflectance layer.

The preliminary high-reflectance part 12 may comprise a preliminary absorbent layer formed on other parts on the protective layer; a preliminary high-reflectance layer 7*c* formed on the preliminary absorbent layer; and an etching prevention layer formed on the preliminary high-reflectance layer. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Figure 3:
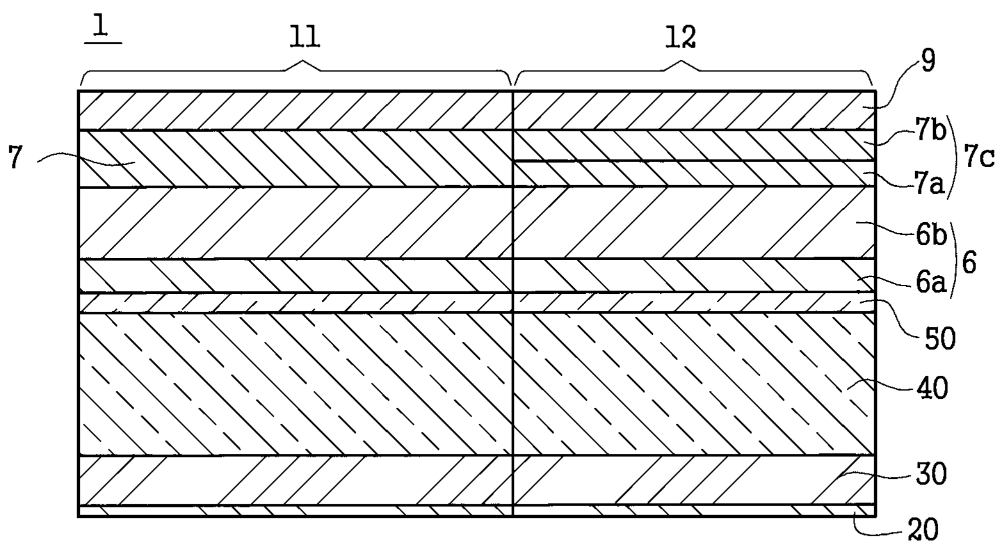
FIG. 3 is a sectional view depicting an example of an internal section of a blank mask for extreme ultraviolet according to example embodiments.

FIG. 3 is a sectional view illustrating an example of an internal section of a blank mask for extreme ultraviolet according to example embodiments.

The blank mask for extreme ultraviolet 1 is one for processing a photomask for extreme ultraviolet 100 to be described below, and some of the features thereof may be similar.

The conductive layer 20 may comprise materials suitable for chucking (fixing with static electricity), and for example, may comprise chrome, tantalum, and the like, but the materials are not limited thereto.

The substrate 30 may comprise quartz glass, titania (titanium dioxide), calcium fluoride, and the like, materials for low thermal expansion, and materials enabling minimization of distortion caused by a temperature increase during an exposure process. For example, the substrate may comprise quartz glass.

The multilayer 40 may be made by first and second layers stacked alternately plural times. Each of the first layers may comprise molybdenum, and each of the second layers may comprise a silicon layer or a beryllium layer. Additionally, an arbitrary material that may be greatly reflected at a wavelength of extreme ultraviolet may be applied to the multilayer. The first layer may have a thickness of 1 nm to 5 nm, and the second layer may have a thickness of 2 nm to 6 nm.

In one non-limiting example, the multilayer 40 may be made by the first and the second layers stacked alternately to have a total of 40 to 200 layers. In another non-limiting example, the first layers and the second layers may be alternately stacked to have a total of 50 to 160 layers.

The multilayer 40 may have a reflectance of at least 0.4 or more, or 0.6 or more for extreme ultraviolet. For example, the multilayer may have a reflectance of 0.7 to 0.9 for extreme ultraviolet with a wavelength of 13.5 nm.

The protective layer 50 may comprise ruthenium, ruthenium silicide, chrome-based materials, or the like. In one example, the protective layer 50 comprises ruthenium.

The protective layer 50 may have a thickness of 1 nm to 4 nm.

A blank mask for extreme ultraviolet 1 may be divided into a preliminary low-reflectance part 11 and a preliminary high-reflectance part 12, excluding the preliminary low-reflectance part, as illustrated in FIG. 3, on the protective layer 50.

The preliminary low-reflectance part 11 may comprise a preliminary absorbent layer 6 and the preliminary low-reflectance layer 7 formed on the preliminary absorbent layer, and an etching prevention layer 9 formed on the preliminary low-reflectance layer.

The preliminary high-reflectance part 12 may comprise a preliminary absorbent layer 6 formed on the protective layer 50 and a preliminary high-reflectance layer 7*c* formed on the preliminary absorbent layer, and an etching prevention layer 9 formed on the preliminary high-reflectance layer.

The preliminary absorbent layer 6 may comprise a preliminary lower absorbent layer 6*a* formed on the protective layer 50 and a preliminary upper absorbent layer 6*b* formed on the preliminary lower absorbent layer.

The preliminary absorbent layer 6*a* may comprise tantalum, tantalum nitride, tantalum oxide, titanium, or the like, and for example, may comprise tantalum nitride.

The preliminary lower absorbent layer 6*a* may have a thickness of 1 nm to 5 nm.

The preliminary upper absorbent layer 6*b* may comprise molybdenum.

The preliminary upper absorbent layer 6*b* may have a thickness of 20 nm to 40 nm, or 24 nm to 36 nm.

The thickness ratio of the thickness of the preliminary lower absorbent layer 6*a*/the thickness of the preliminary upper absorbent layer 6*b* may have a value of 0.025 to 0.25, or 0.05 to 0.15.

The preliminary lower absorbent layer 6*a* and the preliminary upper absorbent layer 6*b* may have a difference in the etching rate from each other, enabling the pattern etching process to be efficiently made when a photomask is processed.

The preliminary low-reflectance layer 7 and the preliminary high-reflectance layer 7*c* may comprise a metal oxide. The metal oxide may comprise any one or more between silica and alumina, and for example, may comprise alumina.

The preliminary low-reflectance layer 7 may have a thickness of 12 nm to 30 nm, or 14 nm to 28 nm when comprising alumina.

The preliminary high-reflectance layer 7*c* may comprise a preliminary first reflective layer 7*a* formed on the preliminary absorbent layer 6 and a preliminary second reflective layer 7*b* formed on the preliminary first reflective layer.

The preliminary first reflective layer 7*a* may be substantially formed as a high-reflectance layer during the processing of a photomask.

The preliminary second reflective layer 7*b* may be etched during the processing of a photomask.

The preliminary first reflective layer 7*a* may have a thickness of 4 nm to 10 nm, or 5 nm to 9 nm when comprising alumina.

The thickness ratio of the thickness of the preliminary low-reflectance layer 7/the thickness of the preliminary first reflective layer 7*a* may have a value of 1.2 to 7.5, or 2 to 6. When such a thickness ratio is applied, it is possible to enable subsequent processes of a photomask to be easily made, and it is possible to embody circuit patterns with different reflectance values effectively by using one mask.

An arbitrary laminate comprising the preliminary low-reflectance layer 7, the preliminary absorbent layer 6, and the protective layer 50 may have a phase difference of 178 degrees to 182 degrees with respect to extreme ultraviolet with the wavelength of 13.5 nm.

The etching prevention layer 9 may comprise a chrome-based material, and may comprise chrome.

The blank mask for extreme ultraviolet 1 may have a composition capable of easy processing to make a photomask for extreme ultraviolet 100 described below from the blank mask.

Photomask for Extreme Ultraviolet 100

In one general aspect, a photomask for extreme ultraviolet 100, according to embodiments, may comprise a conductive layer 20; a substrate 30 formed on the conductive layer; a multilayer 40 formed by different kinds of metals stacked alternately on the substrate; a protective layer 50 formed on the multilayer; a low-reflectance part 101 formed on some parts on the protective layer; and a high-reflectance part 102 formed on other parts on the protective layer.

The low-reflectance part 101 may comprise a first absorbent layer 61 formed on some parts on the protective layer; a low-reflectance layer 71 formed on the first absorbent layer; and a first intagliated part 81 where the protective layer is exposed.

The high-reflectance part 102 may comprise a second absorbent layer 62 formed on other parts on the protective layer; a high-reflectance layer 72 formed on the second absorbent layer; and a second intagliated part 82 where the protective layer is exposed.

FIG. 1 is a sectional view for illustrating one example of an internal section of a photomask for extreme ultraviolet 100 according to example embodiments.

Figure 2:
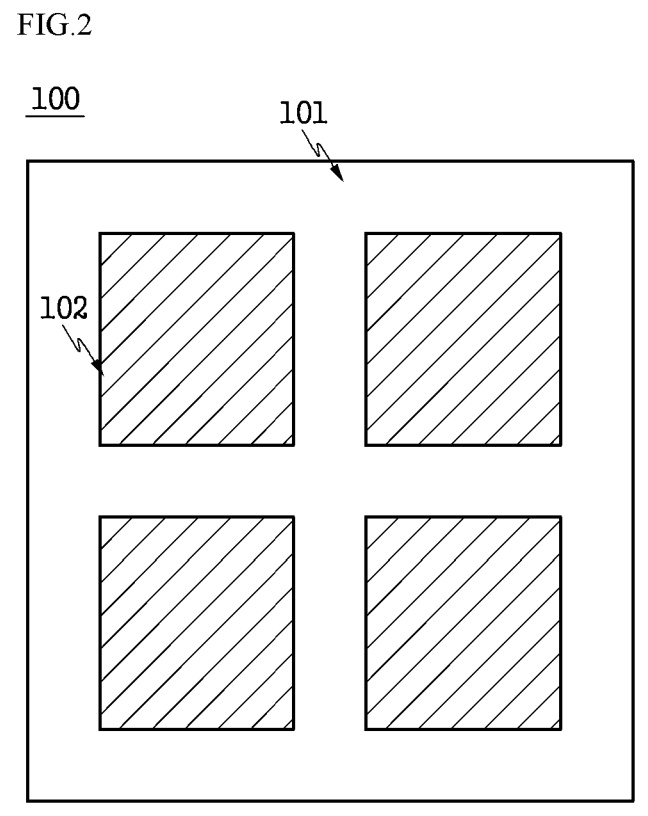

FIG. 2 is a ground plan depicting an upper position view of an example of a photomask for extreme ultraviolet according to example embodiments.

In the wavelength of about 13.5 nm of extreme ultraviolet used to an extreme ultraviolet (EUV) exposure process, most materials have high absorptiveness, and therefore, a reflective optical system is ordinarily used. According to embodiments, a photomask for extreme ultraviolet 100 enables extreme ultraviolet radiated from a light source for exposure to be reflected by the multilayer 40 in the area where the protective layer 50 is exposed. The other areas except the above area have predetermined reflectance values to have a phase difference of 180 degrees. Therefore, extreme ultraviolet can partially be cancelled while absorbed through the first absorbent layer 41 and the second absorbent layer 42.

The conductive layer 20 may comprise materials for chucking (fixing with static electricity) a photomask, for example, chrome, tantalum, and the like, but the materials are not limited thereto.

The substrate 30 may comprise quartz glass, titania (titanium dioxide), and the like, materials for low thermal expansion, and materials enabling minimization of distortion caused by a temperature increase in an exposure process. For example, the substrate may comprise quartz glass.

The multilayer 40 may be made by first and second layers stacked alternately plural times, wherein the first layers may comprise a molybdenum layer, and the second layer may comprise a silicon layer or a beryllium layer. Also, an arbitrary material that can greatly be reflected at a wavelength of extreme ultraviolet may be applied to the multilayer. For example, the first layer may have a thickness of 1 nm to 5 nm, and the second layer may have a thickness of 2 nm to 6 nm.

The multilayer 40 may be one made by the first layers and the second layers stacked alternately to have total 40 to 200 layers, or may be one made by the first layers and the second layers stacked alternately to have total 50 to 160 layers.

The multilayer 40 may have a reflectance for extreme ultraviolet of at least 0.4 or more, or 0.6 or more. For example, the multilayer may have a reflectance of 0.7 to 0.9 with respect to extreme ultraviolet with a wavelength of 13.5 nm.

The protective layer 50 may comprise ruthenium, ruthenium silicide, chrome-based materials, or the like. In an example, the protective layer 50 may comprise ruthenium.

The protective layer 50 may have a thickness of 1 nm to 4 nm.

A photomask for extreme ultraviolet 100 may be divided into a preliminary low-reflectance part 101 and a preliminary high-reflectance part 102, excluding the preliminary low-reflectance part, as illustrated in FIG. 3, on the protective layer 50.

The low-reflectance part 101 may comprise a first absorbent layer 61 formed on the protective layer 50 and a low-reflectance layer 71 formed on the first absorbent layer, and may comprise a first intagliated part 81 where the protective layer 50 is exposed, excluding the low-reflectance area 83 comprising the low-reflectance layer.

The high-reflectance part 102 may comprise a second absorbent layer 62 formed on the protective layer 50 and a high-reflectance layer 72 formed on the second absorbent layer, and may comprise a second intagliated part 82 where the protective layer 50 is exposed, excluding a high-reflectance area 84 comprising the high-reflectance layer.

The first absorbent layer 61 and the second absorbent layer 62 may comprise substantially the same material.

The first absorbent layer 61 and the second absorbent layer 62 may comprise lower absorbent layers 61*a* and 62*a* and upper absorbent layers 61*b* and 62*b*.

The lower absorbent layers 61*a* and 62*a* may comprise tantalum, tantalum nitride, tantalum oxide, titanium, or the like. In one example, the lower absorbent layers 61*a* and 62*a* may comprise tantalum nitride.

The lower absorbent layers 61*a* and 62*a* may have a thickness of 1 nm to 5 nm.

The upper absorbent layers 61*b* and 62*b* may comprise molybdenum or the like.

The upper absorbent layers 61*b* and 62*b* may have a thickness of 20 nm to 40 nm, or 24 nm to 36 nm.

The thickness ratio of the thickness of the lower absorbent layer 61*a* or 62*a*/the thickness of the upper absorbent layer 61*b* and 62*b* may have a value of 0.025 to 0.25, or 0.05 to 0.15.

The low-reflectance layer 71 and the high-reflectance layer 72 may comprise a metal oxide. The metal oxide may comprise any one or more between silica and alumina. In one example, the metal oxide may comprise alumina.

An arbitrary laminate comprising the low-reflectance layer 71, the first absorbent layer 61, and the protective layer 50 may have a reflectance of 3% to 8%, or 4.5% to 7.5% with respect to extreme ultraviolet with the wavelength of 13.5 nm. The reflectance may be a reflectance when the extreme ultraviolet is radiated toward the laminate.

When the low-reflectance layer 71 and the high-reflectance layer 72 have such a reflectance, a circuit with a specific pattern layout can easily be formed by using one photomask in an extreme exposure process with extreme ultraviolet.

An arbitrary laminate comprising the low-reflectance layer 71, the first absorbent layer 61, and the protective layer 50 may have a phase difference of 178 degrees to 182 degrees for extreme ultraviolet with a wavelength of 13.5 nm.

An arbitrary laminate comprising the high-reflectance layer 72, the second absorbent layer 62, and the protective layer 50 may have a phase difference of 178 degrees to 182 degrees for extreme ultraviolet with a wavelength of 13.5 nm.

The low-reflectance layer 71 may have a thickness of 12 nm to 30 nm, or 14 nm to 28 nm when comprising metal oxide such as alumina.

The high-reflectance layer 72 may comprise a thickness of 4 nm to 10 nm, or 5 nm to 9 nm when comprising metal oxide such as alumina.

The thickness ratio of the thickness of the low-reflectance layer 71/the thickness of the high-reflectance layer 72 may have a value of 1.2 to 7.5, or 2 to 6.

When the low-reflectance layer 71 and the high-reflectance layer 72 have the above material and thickness characteristics, a circuit with a specific pattern layout can easily be made in an exposure process with extreme ultraviolet.

The photomask for extreme ultraviolet 100 can easily embody circuit patterns of the main cell area and peripheral & core area applicable to memory cells and the like through a simplified exposure process using extreme ultraviolet without separate replacement of a photomask, in addition to having improved resolution and uniformity.

The photomask for extreme ultraviolet 100 can easily form a circuit having another specific pattern layout in an exposure process with extreme ultraviolet.

Manufacturing Method of Blank Mask for Extreme Ultraviolet

A manufacturing method of a blank mask for extreme ultraviolet may comprise, an operation of alternately forming layers by using different kinds of metals on a substrate of a conductive layer to form a multilayer;

an operation of forming a protective layer on the upper portion of the multilayer;

an operation of dividing the protective layer into some preliminary low-reflectance parts and the other preliminary high-reflectance parts;

an operation of forming a preliminary absorbent layer on the protective layer of the preliminary low-reflectance part and the protective layer of the preliminary high-reflectance part, respectively;

an operation of forming an etching prevention layer on the preliminary low-reflectance layer and the preliminary high-reflectance layer.

Forming a multilayer may be performed by repeating an operation of forming a layer with any one kind of metal on the substrate and then forming a layer with another kind of metal thereon. The operation of forming a multilayer may, for example, be performed by sputtering. Additionally, the operation of forming a multilayer may be performed by the procedures that are forming a molybdenum layer as a first layer, subsequently forming a silicon layer as a second layer on the first layer, and repeating the above processes dozens of times.

In the operation of forming a multilayer, the formation of the first layer may be performed through sputtering with an electric power of 50 W to 200 W under a pressure of 0.2 mTorr to 2.0 mTorr, and a molybdenum layer may be formed through a molybdenum target.

In the operation of forming a multilayer, the formation of the second layer may be performed through sputtering with an RF electric power of 50 W to 200 W under a pressure of 0.2 mTorr to 2.0 mTorr, and a silicon layer or a beryllium layer may be formed through a silicon or beryllium target.

An operation for forming a protective layer may be performed by forming a protective layer on the multilayer. The operation for forming a protective layer may, for example, be performed by sputtering, and ion beam sputtering, DC sputtering, or the like may be applied.

The operation for forming a protective layer may be performed through sputtering with an electric power of 50 W to 200 W under a pressure of 0.2 mTorr to 2.0 mTorr, and may form a protective layer through a target comprising ruthenium, ruthenium silicide, and a chrome-based material.

On the protective layer, some preliminary low-reflectance parts and the other preliminary high-reflectance parts may be distinguished by being demarcated, and preliminary absorbent layers may respectively be formed on the protective layer of the preliminary low-reflectance parts and the protective layer of the preliminary high-reflectance parts. The demarcation may proceed according to a predetermined layout, and for example, as shown in FIG. 2, the demarcation may be made for the protective layer to be processed into a photomask comprising plural high-reflectance parts in a quadrangular shape and low-reflectance parts as the rest thereof.

The formation of the preliminary-absorbent layer may proceed according to the procedures that are forming preliminary lower-absorbent layers on the protective layer of the preliminary low-reflectance layer and the protective layer of the preliminary high-reflectance layer and subsequently forming preliminary upper absorbent layers on the preliminary lower-absorbent layers.

The formation of the preliminary lower absorbent layer may proceed through sputtering with an electric power of 50 W to 200 W under a pressure of 0.2 mTorr to 2.0 mTorr, and a preliminary lower-absorbent layer may be formed through a target comprising tantalum, tantalum nitride, tantalum oxide, titanium, and the like.

The formation of the preliminary upper absorbent layer may proceed through sputtering with an electric power of 50 W to 200 W under a pressure of 0.2 mTorr to 2.0 mTorr, and a preliminary upper-absorbent layer may be formed through a target comprising molybdenum.

The formation of the preliminary low-reflectance layer and the preliminary high-reflectance layer may proceed through sputtering with an electric power of 50 W to 200 W under a pressure of 0.2 mTorr to 2.0 mTorr, and the preliminary low-reflectance layer and the preliminary high-reflectance layer may be formed through a target comprising alumina.

The preliminary high-reflectance layer may be prepared by forming a preliminary first reflexive layer to have a desired thickness first and subsequently forming a preliminary second reflexive layer on the preliminary first reflexive layer. The preliminary first reflexive layer and the preliminary second reflexive layer may be formed by adjusting a time for forming layers under the conditions for sputtering substantially similar to the preliminary low-reflectance layer, and may be formed through a target comprising alumina.

The operation of forming the etching prevention layer may be performed by forming etching prevention layers on the preliminary low-reflectance layer and the preliminary high-reflectance layer. The operation of forming the etching prevention layer may be performed through sputtering.

The operation of forming the etching prevention layer may be performed through sputtering with an electric power of 50 W to 200 W under a pressure of 0.2 mTorr to 2.0 mTorr, and an etching prevention layer may be formed through a target comprising a chrome-based material.

Processing Method of Photomask for Extreme Ultraviolet

A processing method of a photomask for extreme ultraviolet may comprise two kinds of operations that are an operation of manufacturing a blank mask and an operation of patterning the blank mask.

The operation of manufacturing a blank mask is the same as described in the manufacturing method of a blank mask for extreme ultraviolet and thus the overlapped description is omitted.

A processing method of a photomask for extreme ultraviolet according to embodiments may comprise a conductive layer; a substrate formed on the conductive layer; a multilayer formed by different kinds of metals stacked alternately on the substrate; a protective layer formed on the multilayer; a preliminary low-reflectance part which is some parts on the protective layer; and a preliminary high-reflectance part which is the other parts on the protective layer.

The preliminary low-reflectance part may comprise a preliminary absorbent layer formed on some parts on the protective layer; a preliminary low-reflectance layer formed on the preliminary absorbent layer; and an etching prevention layer formed on the preliminary low-reflectance layer.

The preliminary high-reflectance part may comprise an operation of preparing a blank mask for extreme ultraviolet comprising a preliminary absorbent layer formed on other parts on the protective layer; a preliminary high-reflectance layer formed on the preliminary absorbent layer; an etching prevention layer formed on the preliminary high-reflectance layer; an operation of etching the etching prevention layer of the blank mask for extreme ultraviolet, and etching some of the preliminary low-reflectance part and some of the preliminary high-reflectance part for forming a pattern; and an operation of etching the preliminary low-reflectance layer of the preliminary low-reflectance part and the preliminary high-reflectance layer of the preliminary high-reflectance layer to have different thicknesses from each other and thereby forming a low-reflectance part and a high-reflectance part.

The preliminary high-reflectance layer may comprise a preliminary first reflective layer formed on the preliminary absorbent layer; and a preliminary second reflective layer formed on the preliminary first reflectance layer.

The operation of forming a pattern may comprise a process etching some of the preliminary low-reflectance part to form a first intagliated part where a protective layer is exposed, and a process of etching some of the preliminary high-reflectance part to form a second intagliated part where a protective layer is exposed.

The operation of forming the low-reflectance and high-reflectance parts may allow the preliminary low-reflectance layer of the preliminary low-reflectance part and the preliminary high-reflectance layer of the preliminary high-reflectance part to be etched to reach different degrees from each other, and for example, may proceed as follows. First, the entire preliminary low-reflectance part and the preliminary high-reflectance part where patterns have been formed are applied by photoresists, and only areas corresponding to a preliminary high-reflectance part are exposed and removed to be opened. Subsequently, the second reflexive layer of the preliminary high-reflectance layer of the preliminary high-reflectance part may be selectively etched to make the thickness of the preliminary high-reflectance layer be thinner and thereby a high-reflectance layer may be formed.

The low-reflectance part and the high-reflectance part have the same constitution as described in the photomask for extreme ultraviolet above.

The operation of forming a pattern may allow the target area to be selectively etched through a separate mask for etching and thereby a first intagliated part and a second intagliated part may be formed.

Hereinafter, the present disclosure will be described in further detail with reference to accompanying examples. The following embodiments are only examples for understanding the present disclosure, and the range of the present disclosure is not limited to the same.

Manufacturing Example—Manufacture of Laminate Equipped with Low-Reflectance Layer and High-Reflectance Layer A magnetron sputtering apparatus was prepared, and a target was disposed in a chamber in the apparatus to have a distance of 255 mm between the target and a substrate and an angle of 25 degrees between the target and the substrate.

An inert gas atmosphere was formed in the chamber, the electric power of 100 W was applied, and a sputtering process was performed under the pressure of 1 mTorr through a ruthenium target, and thereby an Ru layer as a protective layer was formed to have the thickness of 2 nm.

Some of the protective layer was distinguished as a preliminary low-reflectance part and the other of the protective layer was distinguished as a preliminary high-reflectance part.

After the formation of the protective layer, an atmosphere comprising nitrogen of 40 volume % in the chamber, and a sputtering process was performed under the pressure of 1 mTorr through a tantalum target, and thereby a TaN layer as a preliminary lower absorbent layer was formed to have the thickness of 3 nm.

After the formation of the preliminary lower absorbent layer, a sputtering process was performed under the pressure of 1 mTorr through a molybdenum target, and thereby a Mo layer as a preliminary upper absorbent layer was formed to have a thickness of 31 nm.

After the formation of the preliminary upper absorbent layer, a sputtering process was performed under the pressure of 1 mTorr through an alumina target, and thereby an $Al_2O_3$ layer as a reflective layer was formed to have a thickness of 21 nm.

After the formation of the reflective layer, a sputtering process was performed under the pressure of 1 mTorr through a chrome target, and thereby a Cr layer as an etching prevention layer was formed to have a thickness of 10 nm.

Thereafter, a photoresist was applied, only the areas corresponding to the preliminary high-reflectance part were exposed and removed, and after that, preliminary high-reflectance parts were selectively etched to form a high-reflectance layer of 7 nm made from $Al_2O_3$, and a laminate where a high-reflectance layer made from $Al_2O_3$ and a low-reflectance layer made from $Al_2O_3$ as the rest had been formed was prepared.

Comparative Example—Manufacture of Laminate Comprising TaN Layer

An inert gas atmosphere in the chamber of the sputtering apparatus of the manufacturing example was formed, the electric power of 100 W was applied, and the sputtering process was performed through a ruthenium target under the pressure of 1 mTorr to form an Ru layer of 2 nm as a protective layer.

After the formation of the protective layer, an atmosphere comprising nitrogen of 40 volume % in the chamber was formed, the sputtering process was performed through a tantalum target under the pressure of 1 mTorr, and a TaN layer of 58 nm as a lower absorbent layer was formed, thereby manufacturing a laminate comprising a TaN layer.

Experiment Example—Measurement of Reflectance of Extreme Ultraviolet

The reflectance of extreme ultraviolet with the wavelength of 13.5 nm of the laminate prepared in the Manufacture Example and Comparative Example was measured through MBR available from AIXUV corporation, and the result is shown in Table 1.

TABLE 1

| Index | $Al_2O_3$ | Mo | TaN | Ru | Reflectance of Laminate | Phase Difference |
|---|---|---|---|---|---|---|
| Low-Reflectance Part of Manufacture Example | 21 nm | 31 nm | 3 nm | 2 nm | 5.6% | 180 degrees |
| High-Reflectance Part of Manufacture Example | 7 nm | 31 nm | 3 nm | 2 nm | 25% | 180 degrees |
| Comparative Example | — | — | 58 nm | 2 nm | 1% | — |

As the result of the measurement, a laminate of the low-reflectance layer and below from the low-reflectance part showed a reflectance of about 5.6% for extreme ultraviolet with a wavelength of 13.5 nm, and a laminate of the high-reflectance layer and below from the high-reflectance layer showed a reflectance of about 25% for extreme ultraviolet with the wavelength of 13.5 nm In the case of the Comparative Example comprising a protective layer and a relatively thick TaN layer, the laminate showed a reflectance of about 1%.

According to example embodiments, a manufacturing process for a semiconductor element can be simplified through a mask, including a low-reflectance area with relatively low reflectance and a high-reflectance area with relatively high reflectance.

According to example embodiments, it is possible to achieve an advantage of embodying a circuit pattern related to a semiconductor layout, which may be divided into a main cell area and a peripheral & core area, by using one photomask While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as applying to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A photomask for extreme ultraviolet comprising:
a conductive layer;
a substrate disposed on the conductive layer;
a multilayer, comprising different metals alternately stacked on the substrate;
a protective layer disposed on the multilayer;
a low-reflectance part disposed on a portion of the protective layer, wherein the low-reflectance part comprises a first absorbent layer disposed on the portion of the protective layer, a low-reflectance layer formed on the first absorbent layer, and a first intagliated part formed in the portion such that the protective layer is exposed; and
a high-reflectance part disposed on another portion of the protective layer, wherein the high-reflectance part comprises a second absorbent layer disposed on the other portion of the protective layer, a high-reflectance layer disposed on the second absorbent layer, and a second intagliated part formed in the other portion such that the protective layer is exposed.

2. The photomask for extreme ultraviolet of claim 1, wherein a first layer of the multilayer comprises molybdenum, and
a second layer of the multilayer comprises silicon or beryllium.

3. The photomask for extreme ultraviolet of claim 2, wherein the first layer has a thickness of 1 nm to 5 nm, and the second layer has a thickness of 2 nm to 6 nm.

4. The photomask for extreme ultraviolet of claim 1, wherein the protective layer comprises one selected from the group consisting of ruthenium, ruthenium silicide, a chrome-based material, and combinations thereof.

5. The photomask for extreme ultraviolet of claim 4, wherein the protective layer has a thickness of 1 nm to 4 nm.

6. The photomask for extreme ultraviolet of claim 1, wherein the low-reflectance layer and the high-reflectance layer comprise a metal oxide,
wherein a laminate comprising the low-reflectance layer, the first absorbent layer and the protective layer has a reflectance of 3% to 8% for extreme ultraviolet with a wavelength of 13.5 nm, and
wherein another laminate comprising the high-reflectance layer, the second absorbent layer and the protective layer has a reflectance of 10% to 40% for extreme ultraviolet with the wavelength of 13.5 nm.

7. The photomask for extreme ultraviolet of claim 6, wherein the low-reflectance layer has a thickness of 12 nm to 30 nm, and
the high-reflectance layer has a thickness of 4 nm to 10 nm.

8. The photomask for extreme ultraviolet of claim 6, wherein a thickness ratio of the thickness of the low-reflectance to the thickness of the high-reflectance layer has a value of 1.2 to 7.5.

9. The photomask for extreme ultraviolet of claim 6, wherein the metal oxide comprises one selected from the group consisting of silica, alumina, and combinations thereof.

10. The photomask for extreme ultraviolet of claim 1, wherein each of the first absorbent layer and the second absorbent layer comprises a lower absorbent layer formed on the protective layer, and an upper absorbent layer formed on the lower absorbent layer, and wherein the lower absorbent layer comprises tantalum nitride, and the upper absorbent layer comprises molybdenum.

11. The photomask for extreme ultraviolet of claim 10, wherein the lower absorbent layer has a thickness of 1 nm to 5 nm, and wherein the upper absorbent layer has a thickness of 20 nm to 40 nm.

12. The photomask for extreme ultraviolet of claim 10, wherein a thickness ratio of the thickness of the lower absorbent layer to the thickness of the upper absorbent layer has a value of 0.025 to 0.25.

13. The photomask for extreme ultraviolet of claim 1, wherein an arbitrary laminate comprising the low-reflectance layer, the first absorbent layer, and the protective layer has a phase difference of 178 degrees to 182 degrees for extreme ultraviolet with a wavelength of 13.5 nm, and wherein an arbitrary laminate comprising the high-reflectance layer, the second absorbent layer, and the protective layer has a phase difference of 178 degrees to 182 degrees for extreme ultraviolet with a wavelength of 13.5 nm.

14. The photomask for extreme ultraviolet of claim 1, wherein the multilayer has a reflectance of 0.7 to 0.9 for extreme ultraviolet with a wavelength of 13.5 nm.

15. An extreme ultraviolet photomask comprising:

a substrate disposed on a conductive layer;

a multilayer, comprising a first layer of molybdenum, and a second layer of silicon or beryllium alternately stacked on the substrate;

a protective layer disposed on the multilayer;

a low-reflectance part disposed on a portion of the protective layer, wherein the low-reflectance part comprises a first absorbent layer disposed on the portion of the protective layer, a low-reflectance layer formed on the first absorbent layer, and a first intagliated part formed at in the portion such that the protective layer is exposed; and a high-reflectance part disposed on another portion of the protective layer, wherein the high-reflectance part comprises a second absorbent layer disposed on the other portion of the protective layer, a high-reflectance layer disposed on the second absorbent layer, and a second intagliated part formed in the other portion such that the protective layer is exposed.

16. The extreme ultraviolet photomask of claim 15, wherein the first and the second layers are alternately stacked to have a total number of layers between 40 to 200 layers.

17. The extreme ultraviolet photomask of claim 15, wherein the first and the second layers are alternately stacked to have a total of 50 to 160 layers.

* * * * *